(12) United States Patent
Shen et al.

(10) Patent No.: US 7,526,059 B1
(45) Date of Patent: Apr. 28, 2009

(54) BALANCED GREY CODE UTILIZATION TO INCREASE NVM ENDURANCE

(75) Inventors: Eran Shen, Nahariya (IL); Boris Dolgunov, Ramat Gan (IL)

(73) Assignee: Sandisk IL Ltd., Kfar Saba (IL)

( * ) Notice: Subject to any disclaimer, the term of this patent is extended or adjusted under 35 U.S.C. 154(b) by 0 days.

(21) Appl. No.: 11/965,566

(22) Filed: Dec. 27, 2007

(51) Int. Cl.
  *H03K 21/00* (2006.01)
(52) U.S. Cl. .................. 377/34; 377/26; 377/28
(58) Field of Classification Search ............ 377/26, 377/28, 34
See application file for complete search history.

(56) References Cited

U.S. PATENT DOCUMENTS

| 2,632,058 | A | | 3/1953 | Gray |
| 5,450,460 | A | * | 9/1995 | Stodieck ............... 377/44 |
| 6,249,562 | B1 | * | 6/2001 | Wells ................ 377/26 |
| 6,687,325 | B1 | * | 2/2004 | Wells ................ 377/26 |
| 6,792,065 | B2 | | 9/2004 | Maletsky |
| 6,794,997 | B2 | | 9/2004 | Sprouse |
| 7,245,556 | B1 | | 7/2007 | Pinto et al. |
| 2004/0141580 | A1 | * | 7/2004 | Maletsky ............ 377/3 |

OTHER PUBLICATIONS http://gray-williams.livejournal.com (2007).
"Counting sequences, Gray Codes and Lexicodes," by Suparta, Delft University of Technology (2006).
G.S. Bhat, et al., "Balanced Gray Codes," The Electronic Journal of Combinatorics 3, #R25 (1996).

* cited by examiner

*Primary Examiner*—Tuan T Lam
(74) *Attorney, Agent, or Firm*—Darby & Darby P.C.

(57) ABSTRACT

A counting device includes a set of memory cells, including multiple groups of the memory cells configured to store count words of a count code, which include a less significant word and a more significant word. A controller assigns first and second groups of the memory cells to store the less significant word and the more significant word. The controller increments the less significant word from an initial value up to a first limit in each plurality of successive first iterations and increments the more significant word from an initial value up to a second limit in each of a plurality of successive second iterations in response to reaching the first limit. Upon reaching the second limit, the controller makes a new assignment of the groups of the memory cells that are to store the less significant word and the more significant word.

22 Claims, 7 Drawing Sheets

BALANCED GREY CODE UTILIZATION TO INCREASE NVM ENDURANCE

FIELD OF THE INVENTION

The present invention relates generally to electronic devices and circuits, and specifically to counting devices.

BACKGROUND OF THE INVENTION

There are a number of types of non-volatile memory (NVM) media available that can be programmed multiple times. Examples of such media include electronic memory, such as flash electronically-erasable programmable read-only memory (EEPROM) devices, and optical memory, such as rewritable compact disc (CD) and digital video disc (DVD) media. Such media, however, typically wear out after a certain number of write/erase cycles. Flash EEPROM devices, for instance, are typically rated to endure between 10,000 and 100,000 write/erase cycles, after which the devices become unreliable.

U.S. Pat. No. 6,794,997, to Sprouse, whose disclosure is incorporated herein by reference, describes a method for extending the endurance of non-volatile memory using data encoding. One or more data bits are encoded into a larger number of non-volatile memory bit patterns such that changes to the data bits are distributed across fewer changes per non-volatile memory bit. Non-volatile memory endurance is extended since more changes to the data values are possible than can be supported by underlying changes to individual non-volatile memory bits.

One of the embodiments disclosed in this patent uses Gray codes, which were initially described by Gray in U.S. Pat. No. 2,632,058, whose disclosure is incorporated herein by reference. A Gray code is an encoding of information in which for a defined sequence, only a single bit changes state with each step through the sequence. (A conventional binary counter does not have this property.) According to Sprouse, the use of a Gray code sequence stored in non-volatile memory to encode a single data bit in effect allows the previous contents of the non-volatile memory to be used to control the next state. Thus, each single data bit change is translated into a single non-volatile memory bit change, and is distributed across multiple non-volatile memory bits.

U.S. Pat. No. 7,245,556, to Pinto, et al., whose disclosure is incorporated herein by reference, similarly describes methods for writing to non-volatile memories for increased endurance. A relatively small memory is made up of a number of individually-accessible write segments, each made up of a single memory cell or a small number of cells. A count is encoded so that it is distributed across a number of fields, each associated with one of the write segments. As the count is incremented, only a single field is changed, and these changes are evenly distributed across the fields. The changed field is then written to the corresponding segment, while the other write segments are unchanged. Consequently, the number of rewrites to a given write segment is decreased, and the lifetime correspondingly increased, by a factor corresponding to the number of write segments used.

Another approach to counting beyond endurance limits of non-volatile memories is described by Maletsky in U.S. Pat. No. 6,792,065, whose disclosure is incorporated herein by reference. The storage cells in a non-volatile memory are subdivided into two groups, one for the implementation of a rotary counter that keeps track of the less significant part of the count and another for a binary counter that keeps track of the more significant part of the count. The rotary counter implements a counting method that maximizes the count that can be obtained before the endurance limit of the memory is reached by making sure that each change of state of each cell is recorded as one count and that all cells in the rotary counter experience two change of state in every cycle. The binary counter records the number of cycles the rotary counter has gone through.

SUMMARY OF THE INVENTION

An embodiment of the present invention provides a counting device, including a memory which includes a set of memory cells, including multiple groups of the memory cells that are configured to store respective count words of a count code, the count words including at least a less significant word and a more significant word. The controller is coupled to the memory cells so as to make a first assignment of the groups of the memory cells that are to store the respective count words, which includes assigning first and second groups of the memory cells to store the less significant word and the more significant word, respectively, and to increment, in response to occurrences of a count input, the less significant word from an initial value up to a first limit in each of a plurality of successive first iterations, and to increment, in response to reaching the first limit in each of the successive first iterations, the more significant word from an initial value up to a second limit in each of a plurality of successive second iterations, and upon reaching the second limit, to make a second assignment, different from the first assignment, of the groups of the memory cells that are to store the less significant word and the more significant word, respectively, and to continue the first and second iterations subject to the second assignment.

In a disclosed embodiment, the count words include a respective balanced count code, such as a balanced Gray code, and the memory is a non-volatile memory, such as a Flash memory. The limit for each iteration is defined by a maximum value given by a number of the bits in each of the count words. At least one of the memory cells is assigned to store a state indicator and the controller is coupled to increment the state indicator upon making the second assignment.

In some embodiments, the controller is configured to read a value of the count code by decoding the state indicator so as to identify the groups of the memory cells storing the less significant word and the more significant word. The less significant word and the more significant word are swapped between the first and second groups of the memory cells upon making the second assignment.

In other embodiments, the count code includes, in addition to the less significant and more significant words, at least a third count word, which is stored in a third group of the memory cells in accordance with the first assignment. The less significant word, the more significant word, and the third count word are swapped among the groups of the memory cells upon making the second assignment. The third count word has a level of significance between the more and less significant words.

There is further provided, in accordance with an embodiment of the present invention, a method for counting, including defining a count code including multiple count words, which include at least a less significant word and a more significant word. A first assignment of first and second groups of memory cells is made among multiple groups of the memory cells in a memory, to store the less significant word and the more significant word, respectively. The less significant word is incremented from an initial value up to a first limit in each of a plurality of successive first iterations in response to occurrences of a count input. The more significant word is incremented from an initial value up to a second limit in each of a plurality of successive second iterations in response to reaching the first limit in each of the successive first iterations. A second assignment is made of the groups of memory cells that are to store the less significant word and the more significant word, different from the first assignment. The first and second iterations are continued, subject to the second assignment.

The present invention will be more fully understood from the following detailed description of the embodiments thereof, taken together with the drawings in which:

DETAILED DESCRIPTION OF EMBODIMENTS

Overview

Figure 1:
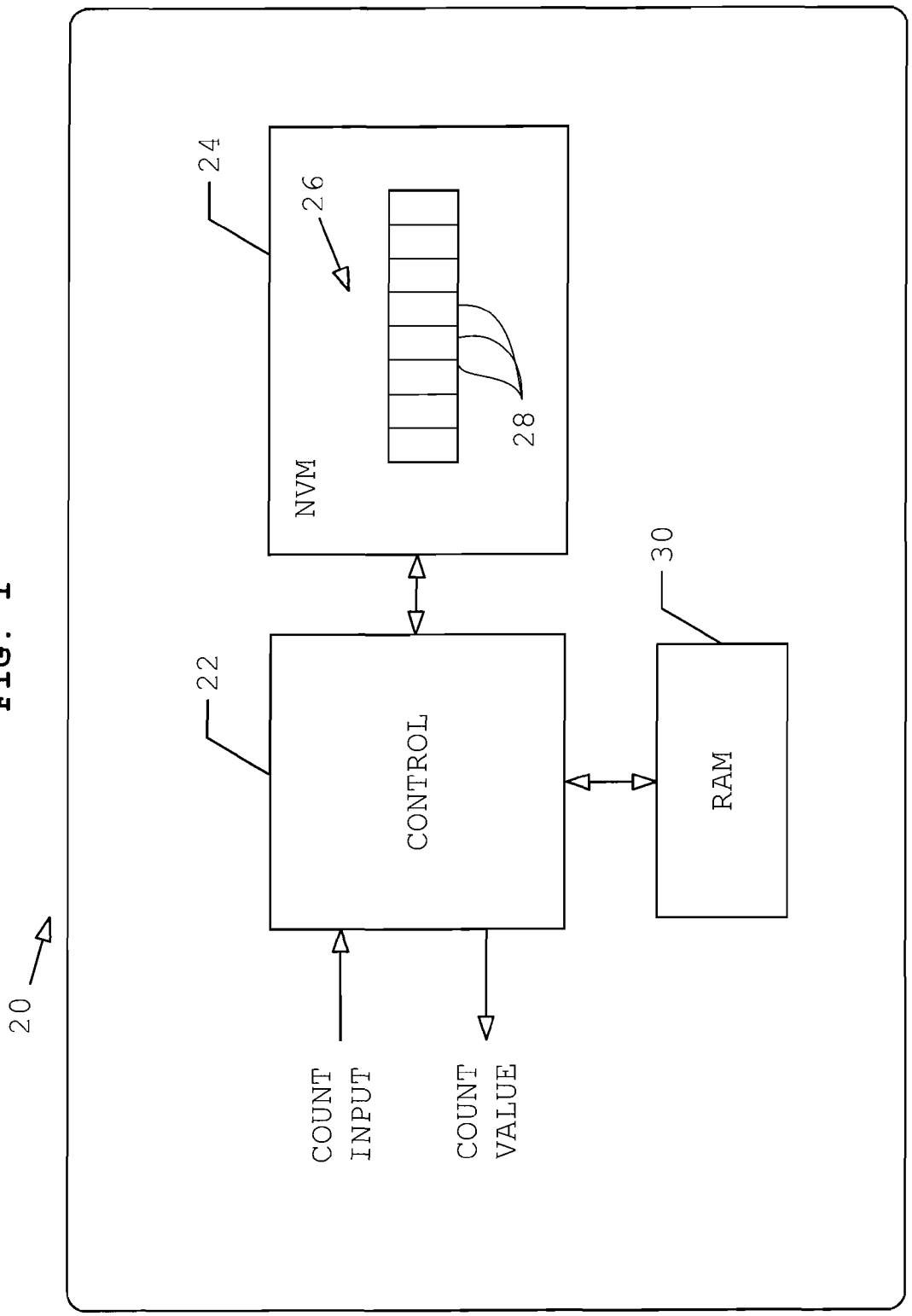
FIG. 1 is a block diagram that schematically illustrates a counting device, in accordance with an embodiment of the present invention.

As described in the Background of the Invention, the range of a counter that is implemented in non-volatile memory (NVM) is limited by the write/erase endurance of the memory itself, i.e., by the number of times a value stored in a cell of the memory can be changed before the memory cell wears out. Other concerns that must be addressed when implementing a counter on NVM include code simplicity, access time, and material costs.

Gray codes are helpful in extending the endurance limit, since they minimize the number of bits that must be inverted each time the counter is incremented. Even so, in the standard Gray code described in the above-mentioned U.S. Pat. No. 2,632,058, the least significant bit (LSB) is toggled twice as frequently as the next bit, and so forth: In counting up to a value N, the LSB is inverted N/2 times, the next bit N/4 times, the next N/8, and so forth. Therefore, when this Gray code is used in the ordinary way, the LSB will wear out long before the other bits, and the maximum value that the counter can reach will thus be limited to a value equal approximately to twice the bit endurance of the LSB.

The use of "balanced Gray codes" resolves this issue by evenly distributing the physical bit inversions required to increment the counter. Unfortunately, some extant implementations of counters that utilize balanced Gray codes for large numbers of bits require dedicated hardware, increasing material costs while increasing solution complexity. Other implementations require large tables of binary-to-Gray conversion code values, which require significant resources to store and manage.

Embodiments of the present invention extend the range of a NVM counter utilizing a solution that is simple to implement and does not require dedicated hardware or a large table of Gray conversion values. In these embodiments, the bits of a count code, in this case a balanced Gray code, are stored in a set of the memory cells in at least two count words. One count word will store a less significant word (LSW) and another will store a more significant word (MSW). One or more additional memory cells are used to store a state indicator. The state indicator designates which count word contains the LSW at any given time.

The code value may be updated at each count by reading the next balanced Gray code from a lookup table of balanced Gray code values. Alternatively, a binary-to-balanced-Gray-code conversion table may be used to convert each incremented binary value to a corresponding balanced Gray code. The same table may be used for all of the count words, so that only a small table is needed to count up to large values. The lookup table may be stored in random access memory (RAM), a form of volatile memory, or in non-volatile memory. Alternatively, balanced-Gray-code progression and/or conversion progression may be implemented in dedicated hardware logic, or using a combination of hardware and software elements.

In one embodiment, the size of each count word in a 16-bit counter is a byte and the size of the state indicator is a single bit. A byte (8-bit) sized count word can store up to 256 unique values. The binary-to-balanced-Gray-code lookup table therefore contains the corresponding 256 balanced Gray code values. At each occurrence of a count input, the LSW is incremented from an initial value up to a predefined limit as defined by the size of the count word. (Typically, although not necessarily, the limit corresponds to the maximum value that a count word can store.) The count word rolls over to have the value zero upon being incremented after reaching the limit, and the next most significant count word is then incremented. The binary value of the count may be converted to the corresponding balanced Gray code using a conversion table, or the next balanced Gray code may simply be read from a lookup table. The balanced Gray code determines which bit in the LSW should be inverted and the bit inversion is performed.

Upon receipt of a count input, if the maximum value of the less significant count word is reached, the LSW is reset to have a zero value. (This reset may be implicit, as the balanced Gray code lookup table may simply roll over to the initial (zero) value when the limit value is provided as the input.) The more significant count word value is also read and incremented in similar fashion to the less significant word. The balanced Gray code value determines which bit in the MSW should be inverted and the bit inversion is performed. When the maximum value of the more significant count word is reached, the MSW is reset to have a zero value. The state indicator is then incremented and the assignments are rotated so that the LSW and MSW are assigned to different count words. Thus the wear due to bit inversion is spread evenly over the words in the counter.

In this embodiment of the present invention, the bits in the first count word, which is initially assigned to store the LSW, are inverted 8192 times while the state indicator has the value zero. The bits in the first count word are then flipped an additional 32 times while it is assigned to store the MSW, while the state indicator has the value one, identifying that the location of the LSW has been swapped. The counter in this embodiment utilizes only 17 bits of NVM, and each of the count word bits is inverted only 8,224 times in counting from 0 to $2^{17}$. The balanced Gray code lookup table contains only 256 values. Thus, the counter can reach a large value while making efficient use of memory resources.

Although the embodiments described herein use single-level memory cells, each holding a single bit, the principles of the present invention may likewise be applied to substantially any kind of multiple-time programmable NVM, including multi-level cells and other technologies. The techniques described herein may also be used, mutatis mutandis, in encoding a count so that it is distributed across a number of fields, in a manner analogous to that described in the above-mentioned U.S. Pat. No. 7,245,556.

Design and Operation of the Counting Device

FIG. 1 is a block diagram that schematically shows a counting device 20, in accordance with an embodiment of the present invention. A controller 22 receives a count input, which typically signals the occurrence of a given type of event that is to be counted. The controller may comprise a programmable computing device, such as a microprocessor, which carries out the functions that are described herein under the control of software or firmware. Alternatively or additionally, the controller may comprise a hard-wired or programmable logic device, such as a suitable application-specific integrated circuit (ASIC).

Controller 22 is coupled to write to and read from a non-volatile memory (NVM) 24, comprising an array of memory cells 28. At each occurrence of the count input, the controller increments a count code that is held in a set 26 of the memory cells, as described in detail hereinbelow. The controller may subsequently read and decode the count code in order to output a count value that reflects the cumulative number of occurrences of the count input. On the other hand, in some applications (such as certain data security applications), there may be no need to decode the count code. Rather, the count code may need to change to indicate that an activity has taken place in a controlled fashion, but the decoded value of the count code may have no meaning to the application. In such embodiments, the count code may be incremented without being decoded. The controller and memory in device 20 may be dedicated for use in this counting function. Alternatively, the controller and memory may also perform other functions, in addition to counting occurrences of the count input, but these functions are beyond the scope of the present invention. Optionally, for enhanced efficiency and speed, controller 22 may use a volatile random-access memory (RAM) 30 for some of the computational functions that are described hereinbelow.

In the present embodiment, it is assumed that NVM 24 comprises an array of NAND flash memory cells. In alternative embodiments, however, the NVM may comprise NOR flash or another type of EEPROM, or substantially any other type of NVM that permits multiple-time programming, including read/write optical memory media.

Figure 2:
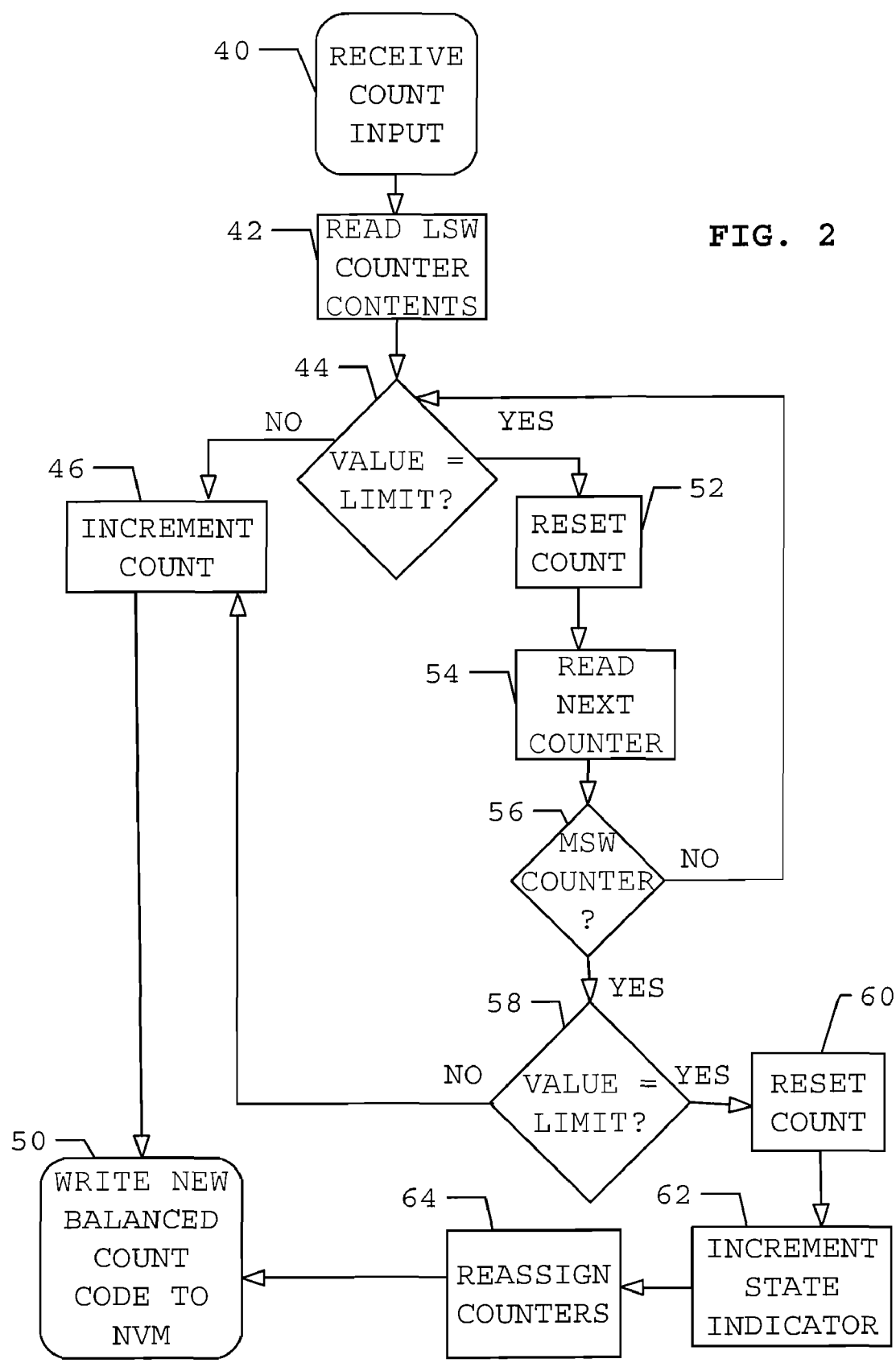
FIG. 2 is a flow chart that schematically illustrates a method for counting using a non-volatile memory, in accordance with an embodiment of the present invention.
Figure 3A:
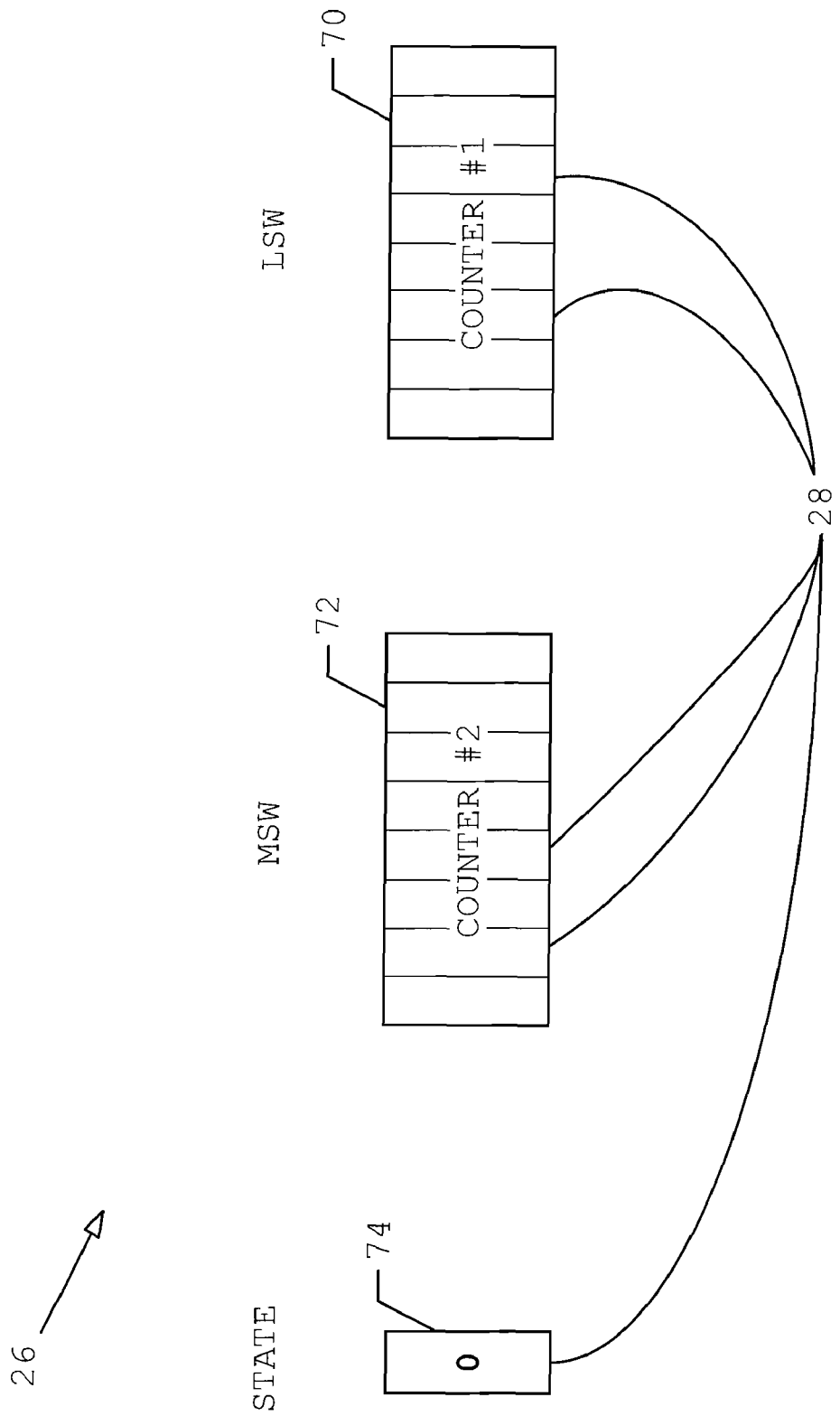
FIGS. 3A and 3B are block diagrams that schematically illustrate iterations of a counter in accordance with an embodiment of the present invention.
Figure 3B:
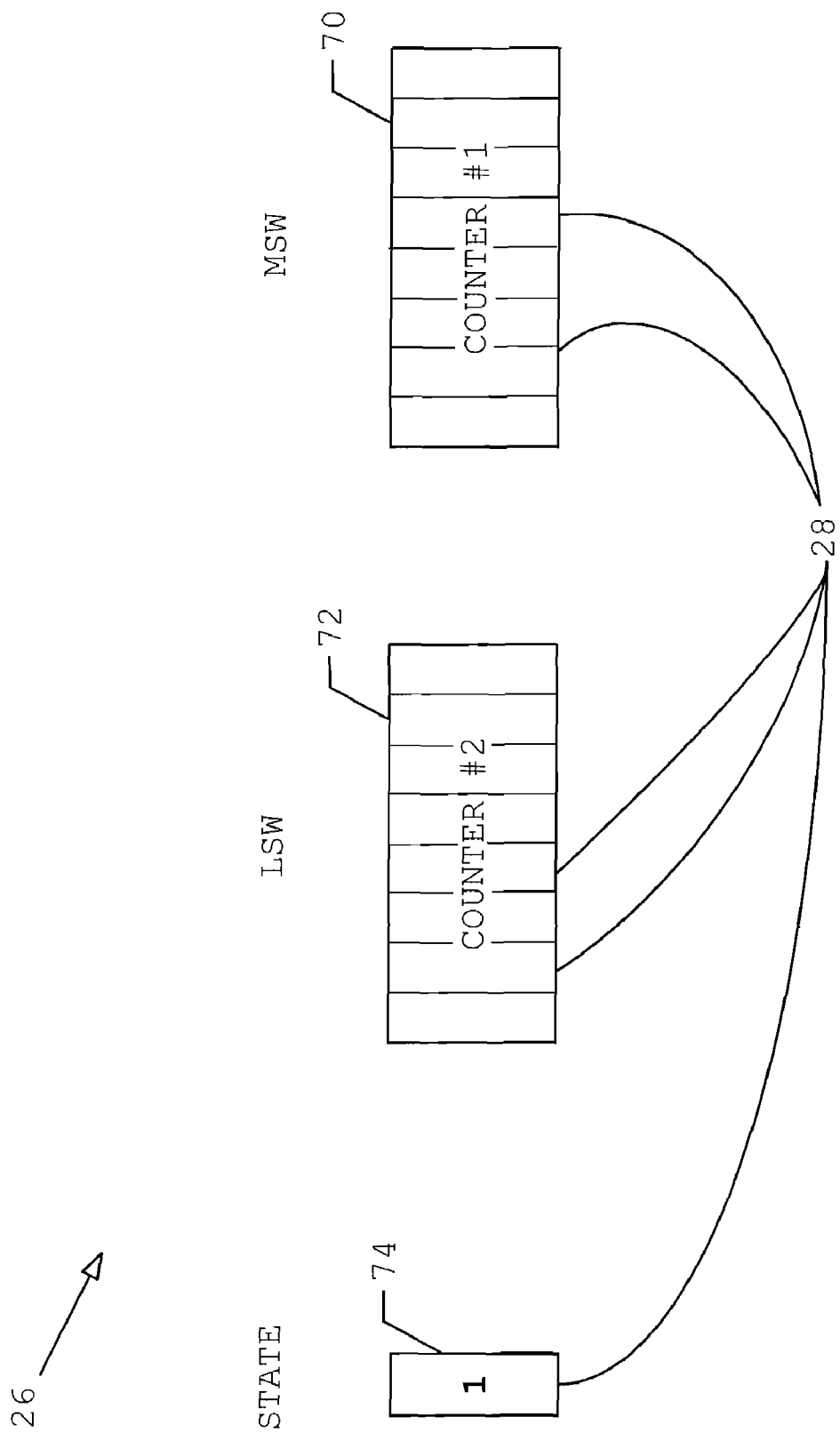
Figure 5A:
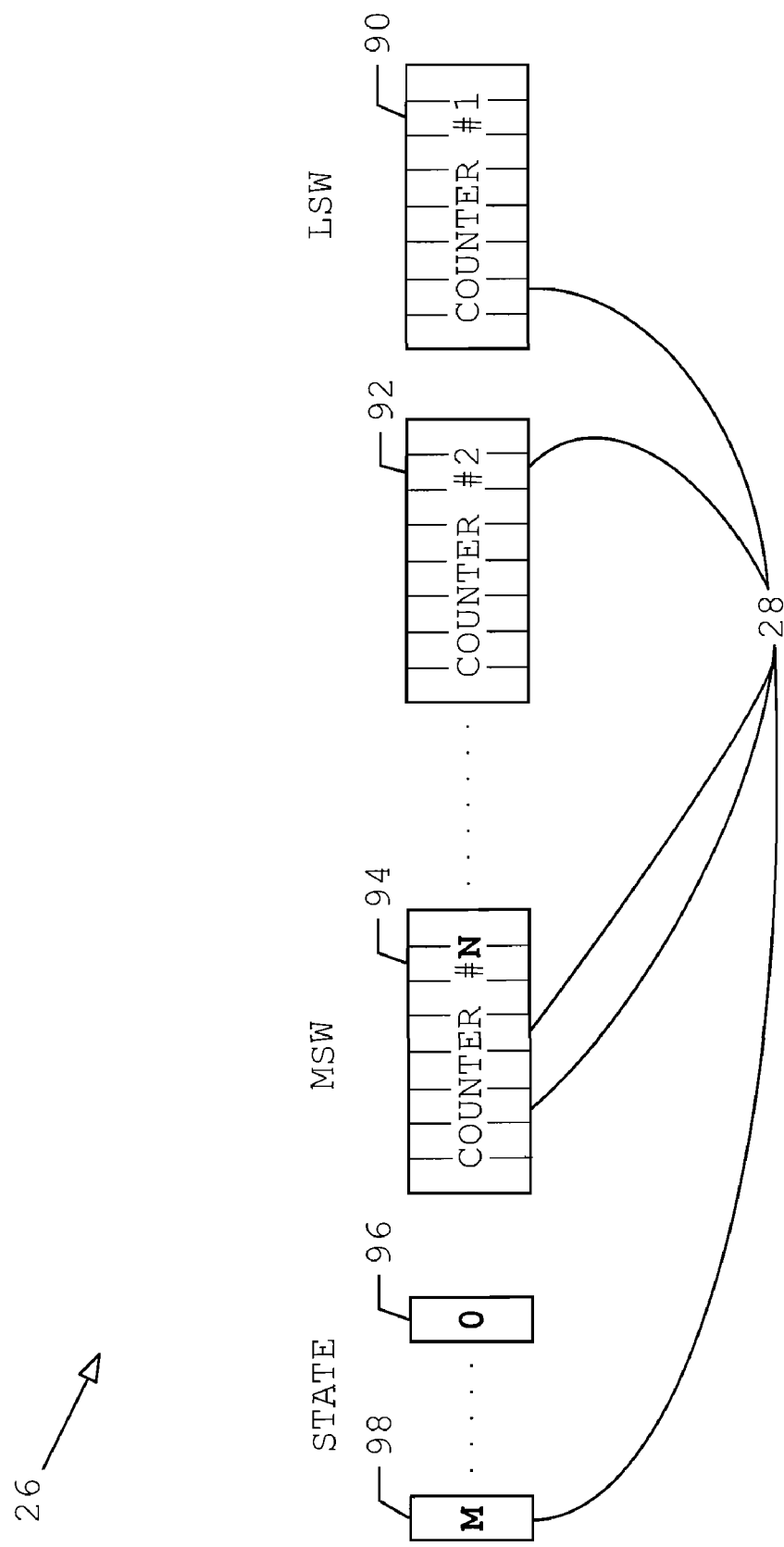
FIGS. 5A and 5B are block diagrams that schematically illustrate iterations of a counter in accordance with an alternative embodiment of the present invention.
Figure 5B:
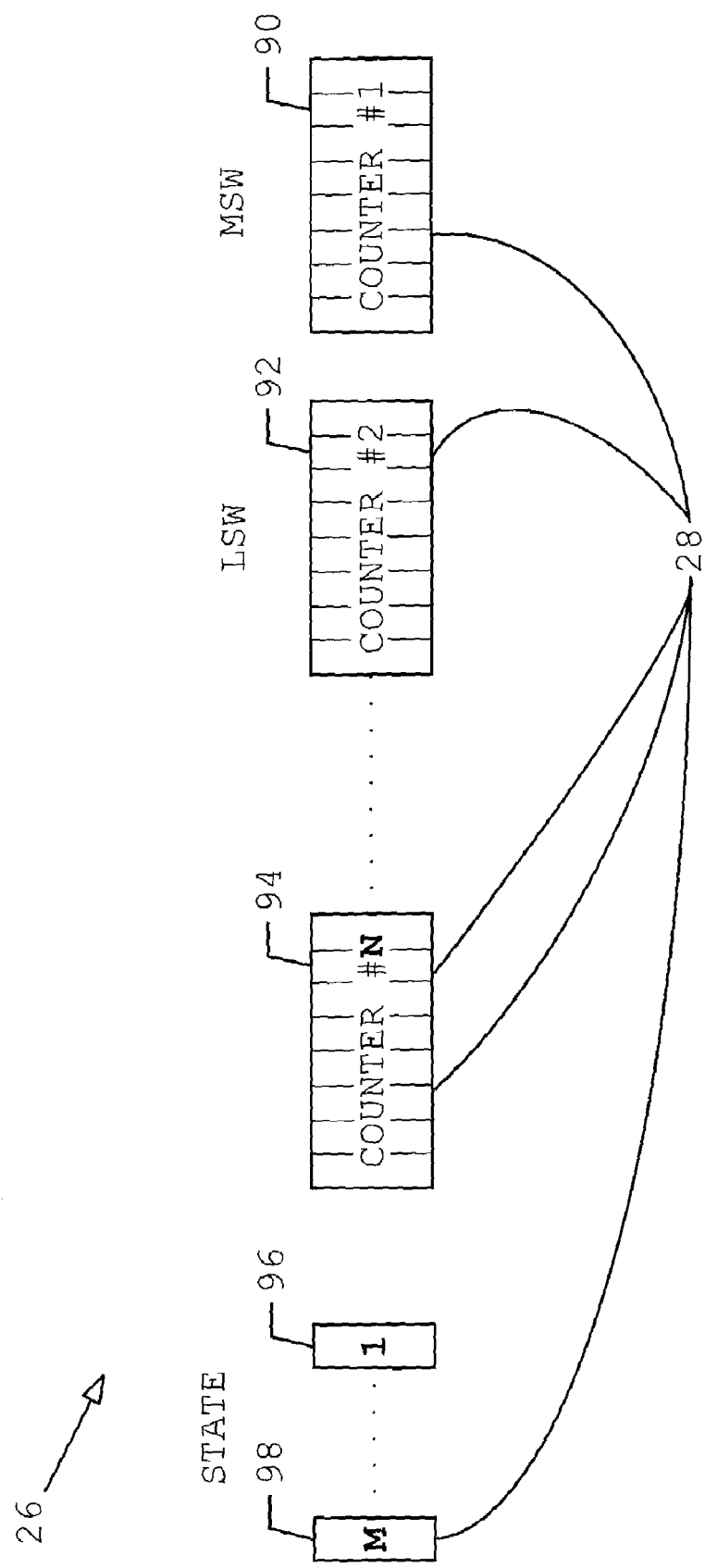

Reference is now made to FIGS. 2, 3A and 3B, which schematically illustrate a method for counting using device 20, in accordance with an embodiment of the present invention. FIG. 2 is a flow chart showing the steps of the method. FIGS. 3A and 3B are block diagrams that schematically illustrate iterations of count words and state indicators at successive iterations of the counter in accordance with this method. For simplicity, we will initially describe the flow in FIG. 2 with reference to the example using two count words that is illustrated in FIGS. 3A and 3B. We will then return to describe the flow in FIG. 2 with an example using any number (2 ... N) of count words greater than two as illustrated in FIGS. 5A and 5B.

As shown in FIGS. 3A and 3B, set 26 in this embodiment comprises count words 70, 72, of eight bits each. Set 26 also includes a state indicator 74, which in the present example comprises one bit. The numbers of bits in the count words and in the state indicator were chosen in this example solely for the sake of convenience and clarity of explanation. These words may alternatively comprise larger or smaller numbers of bits, depending on factors such as the endurance of the memory, the maximum target count value, and the availability of cells in the memory. In this embodiment, the overall count code comprises seventeen bits.

The count code in count words 70 and 72 begins at an initial value (typically zero) with state indicator 74 in state zero and is incremented each time controller 22 receives a count input, at an input step 40. To determine the new count code that is to be written to the LSW count word 70, the controller reads the current LSW count word value, at a read step 42. For this purpose, it may be necessary for the controller to read out and decode the count code and state from NVM 24, in the manner described hereinbelow in reference to FIG. 4. Alternatively, during active operation of device 20, the controller may use RAM 30 as a sort of cache, to hold the current counter value and thus avoid the need to read out the value in the NVM at every count. Further alternatively, in some embodiments, as explained above, the count code may be incremented without being decoded.

The LSW count word has a preset limit, which corresponds to the maximum value that the count word is allowed to reach. This limit may be determined according to the size of the count word. In the present example, the count word maximum value is 256, as explained above. The controller checks the current LSW count word value against this limit, at a value checking step 44. If the value has not reached the limit, the controller simply increments the LSW count word, at a count incrementing step 46. The controller looks up the next balanced Gray code and writes the value to LSW count word 70, at a write step 50, simply by inverting the appropriate bit. An alternative method may be performed utilizing binary arithmetic, whereby the controller converts the binary value of the LSW count word to a corresponding balanced Gray code value and writes the new balanced Gray code value to the LSW count word, at write step 50. The value in state indicator 74 is unchanged. An exemplary 8-bit balanced Gray code that may be used by the controller is shown below in an Appendix.

On the other hand, if the controller determines at step 44 that the LSW count word has reached the limit value, it resets the LSW count word to the initial (zero) value, at a reset step 52. The description of steps 54 and 56 for embodiments of the current invention in which there are more than two count words is omitted here but will be described hereinbelow. The controller next reads the current MSW count word value, at a read step 54. For this purpose, it may be necessary for the controller to read out and decode the count code and state from NVM 24, in the manner described hereinbelow in reference to FIG. 4. Alternatively, as noted above, the MSW value may be cached in RAM 30 during active operation of device 20. Further alternatively, in some embodiments, as explained above, the count code of the MSW may be incremented without being decoded.

The MSW count word has a preset limit, which corresponds to the maximum value that the count word is allowed to reach. This limit may be determined according to the size of the count word or the endurance of NVM 24. In the present example, the count word maximum is set to 256, as explained above. The controller checks the current MSW count word value against this maximum, at a value checking step 58. If the value is less than the maximum, the controller simply increments the MSW count word, at count incrementing step 46. The controller looks up the next balanced Gray code and writes the new values of the MSW and LSW to count words 72 and 70, at write step 50, simply by inverting the appropriate bits. It is desirable, although not essential, that the MSW value be written to NVM 24 before the LSW value in order to enhance resistance to data loss and tampering in case of power failure. The value in state indicator 74 is unchanged.

If the controller determines at step 58 that the MSW count word has reached the maximum value, it resets the MSW count word to the initial (zero) value at a reset step 60. Alternatively, as noted above, the MSW count word can be reset prior to the LSW count word being reset in reset step 52 in order to decrease risk in case of a power failure. Next, the state indicator is incremented at a state incrementing step 62. In the current example, the state indicator value of zero in FIG. 3A is incremented to store a value of one as illustrated by state indicator 74 in FIG. 3B. The controller rotates the count word assignments so that the LSW and the MSW are assigned to different count words in a count word reassignment step 64. In the case with two count words, as shown in FIGS. 3A and 3B, the LSW and MSW assignments are simply swapped.

A new iteration through the range of count word values will now begin. When the next count input is received in step 40, the binary value of the LSW count word is incremented at count incrementing step 46, with the LSW count word now assigned to what had been, during the first iteration, the MSW count word. Based on the value of one in state indicator 74, as illustrated in FIG. 3B, the controller determines that the LSW is now assigned to count word 72. As there are two count words in the current example, the controller therefore derives that the MSW is now assigned to count word 70.

Figure 4:
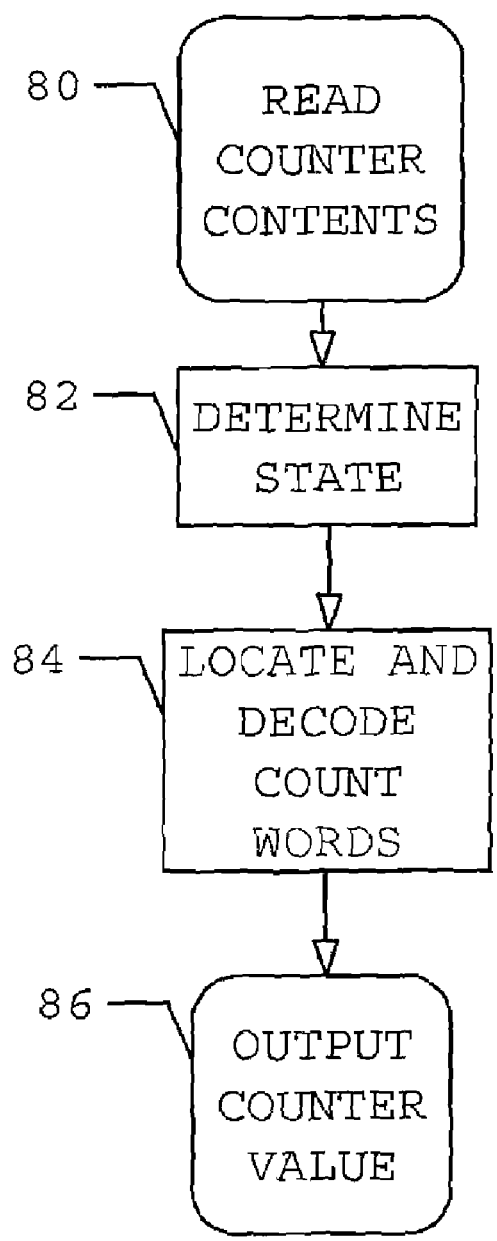
FIG. 4 is a flow chart that schematically illustrates a method for reading a counter value from a counting device, in accordance with an embodiment of the present invention.

FIG. 4 is a flow chart that schematically illustrates a method for reading a count value from device 20, in accordance with an embodiment of the present invention. This method may be used by controller 22 in response to a request from an external source, such as a host CPU (not shown). Additionally or alternatively, it may be invoked internally by controller 22 when it needs to determine the count value for a count word, such as at steps 42 and 54 (FIG. 2).

Controller 22 reads the contents of cells 28 in set 26, at a read step 80, including the count words containing the count code and the state indicator. The counter then determines the location of the LSW and MSW count words by interpreting the state value, at a state determination step 82. The controller reads the count words and may decode them, using a lookup table, for example, to recover the numerical value of the code, at a decoding step 84. The controller then outputs the counter value, at an output step 86, wherein the output value for the example with two count words is given by the formula:

$$\text{output} = (2^{x} * \text{decode}(MSW) + \text{decode}(LSW))$$

when the state indicator is zero (wherein x is the size in bits of each count word). When the state indicator is set to one, meaning that the MSW and LSW word count assignments have been swapped, $2^{16}$ is added to the formula output.

In this example, with two count words of 8 bits each and a state indicator of one bit in size, the counter will be able to count up to a maximum value of $2^{17}$. Each count word bit is inverted only 8,224 times while counting up to the maximum value. If the endurance of NVM 24 is sufficient, the count range may be extended, for example, by adding one or more additional state indicator bits and thus permitting additional count cycles while swapping the LSW and MSW back and forth between count words 70 and 72.

Alternative Embodiments

Reference is now made to FIGS. 5A and 5B, which schematically illustrate a method for counting using device 20, in accordance with an alternative embodiment of the present invention. FIGS. 5A and 5B are block diagrams that show the positions of the count words and values of the state indicator bits at successive iterations of the counter in accordance with this method. We will now describe the flow in FIG. 2 with an example using any number of count words greater than two (2 . . . N) as illustrated in FIGS. 5A and 5B.

As shown in FIGS. 5A and 5B, set 26 in this embodiment comprises count words 90, 92, and 94 of eight bits each. Set 26 also comprises a state indicator, comprising bits 96 and 98 in the present example together comprises two bits. The initial value for the state indicator is set to zero in FIG. 5A. The numbers of bits in the count words and the number of count words were chosen in this example solely for the sake of convenience and clarity of explanation. These words may alternatively comprise larger or smaller numbers of bits, depending on factors such as the endurance of the memory, the maximum target count value, and the availability of cells in the memory.

The operation of this embodiment is similar to that of the embodiment of FIGS. 3A and 3B, except that any number of code words, two or more, may be used to store the count. The state indicator should be larger than one bit when more than two code words are used. The required size of the state indicator, in bits, is given by ceil $[\log_2(s)]$, wherein s is the number of states used in the counter. This alternative embodiment differs from the flow described for FIG. 2 hereinabove, starting when the controller determines at step 44 that the LSW count word, initially assigned to count word 90, has reached the limit value, and resets the LSW count word to the initial (zero) value, at reset step 52.

The controller then reads the next count word value, at read step 54. When there are more than two count words, the next count word will be more significant than the LSW, but may be of intermediate significance and may not contain the MSW. The controller may decode the current state from NVM 24, in the manner described hereinabove in reference to FIG. 4 to determine whether the next count word is the MSW at an MSW determination step 56. If the current count word is not the MSW (for example, in FIG. 5A the next count word after the LSW is count word 92), the controller checks the current count word value against the count word limit value at value checking step 44 and proceeds through the appropriate steps in FIG. 2 to increment this count word as described hereinabove.

When the controller reaches the MSW at step 56 (count word 94 in FIG. 5A), the controller checks the current count word value against the limit, at value checking step 58. If the controller finds that the count word value of the MSW has not reached the limit at step 58, it simply increments the MSW count word, at count incrementing step 46. The controller looks up the next balanced Gray code and writes the value to MSW count word 94, at write step 50, simply by inverting the appropriate bit. The values of state indicator bits 96, 98 are unchanged.

On the other hand, if the controller determines at step 58 that the MSW count word has reached the limit value, it resets the MSW count word to the initial (zero) value at reset step 60. Next, the state indicator is incremented at state incrementing step 62. In the current example, the state indicator value of zero in FIG. 5A is incremented as illustrated in FIG. 5B by state indicator bits 96, 98. The controller next rotates the count word assignments so that the LSW and the MSW are assigned to different count words in count word reassignment step 64. Thus, in FIG. 5B, count word 90 is assigned to store the MSW. Count word 92 is now assigned to store the LSW, while count word 94 is assigned to store a word of intermediate significance.

A new iteration through the range of count word values will now begin. When the next count input is received in step 40, the controller reads the binary value of the LSW count word, now assigned to count word 92. The controller decodes state indicator bits 96 and 98, and the incremented state value conveys that the LSW is now assigned to count word 92 and that the MSW is now assigned to count word 90. The controller assignment of the MSW and LSW is rotated, mutatis mutandis, for any number N of count words greater than one, upon each reset of the MSW at reset step 60 (FIG. 2).

APPENDIX

Balanced Gray Code

In the embodiments of the present invention that are described hereinabove, the count word size is eight bits, requiring a conversion table of binary to balanced Gray code values. There are 256 total values that an 8-bit count word can store, and therefore the lookup table contains 256 distinct conversion value pairs. As described hereinabove, the conversion values are used to increment count words by changing only a single bit at each iteration, and the bit inversions are spread evenly across all bits.

Table I below shows a hexadecimal representation of an 8-bit binary balanced Gray code that may be used for this purpose, as described in a dissertation by Suparta entitled "Counting Sequences, Gray Codes and Lexicodes," (Delft University of Technology, 2006). Each bit is inverted exactly 32 times as the values are incremented from 0-255.

TABLE I

8 BIT BALANCED GRAY CODES 00 01 03 02 06 0E 0A 0B 09 0D 0F 07 05 04 0C 08
18 1C 14 15 17 1F 3F 37 35 34 3C 38 28 2C 24 25
27 2F 2D 29 39 3D 1D 19 1B 3B 2B 2A 3A 1A 1E 16
36 3E 2E 26 22 32 12 13 33 23 21 31 11 10 30 20
60 70 50 51 71 61 63 73 53 52 72 62 66 6E 7E 76
56 5E 5A 7A 6A 6B EB EA FA DA DE D6 F6 FE EE E6
E2 F2 D2 D3 F3 E3 E1 F1 D1 D0 F0 E0 A0 B0 90 91
B1 A1 A3 B3 93 92 B2 A2 A6 AE BE B6 96 9E 9A BA
AA AB BB 9B 99 9D DD D9 DB FB 7B 5B 59 5D 7D 79
F9 FD BD B9 A9 E9 69 6D 6F 67 65 64 E4 E5 E7 EF
ED AD AF A7 A5 A4 AC EC 6C 68 E8 A8 B8 F8 78 7C
FC BC B4 B5 B7 F7 F5 F4 74 75 77 7F FF BF 9F DF
5F 57 55 54 D4 D5 D7 97 95 94 9C DC 5C 58 D8 98
88 C8 48 4C CC 8C 84 C4 44 45 C5 85 87 C7 47 4F
CF 8F 8D CD 4D 49 C9 89 8B CB 4B 4A CA 8A 8E CE
4E 46 C6 86 82 C2 42 43 C3 83 81 C1 41 40 C0 80

Alternatively, other count codes, including other types of balanced codes, may be used for the purposes described above. Furthermore, as noted earlier, other embodiments of the present invention may use count words that are smaller or larger than the 8-bit examples given above, with correspondingly smaller or larger balanced codes.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A counting device, comprising:
    a memory comprising a set of memory cells, comprising multiple groups of the memory cells that are configured to store respective count words of a count code, the count words comprising at least a less significant word and a more significant word; and
    a controller, which is coupled to the memory cells so as to make a first assignment of the groups of the memory cells that are to store the respective count words, which includes assigning first and second groups of the memory cells to store the less significant word and the more significant word, respectively, and to increment, in response to occurrences of a count input, the less significant word from an initial value up to a first limit in each of a plurality of successive first iterations, and to increment, in response to reaching the first limit in each of the successive first iterations, the more significant word from an initial value up to a second limit in each of a plurality of successive second iterations, and upon reaching the second limit, to make a second assignment, different from the first assignment, of the groups of the memory cells that are to store the less significant word and the more significant word, respectively, and to continue the first and second iterations subject to the second assignment.

2. The device according to claim 1, wherein each of the count words comprises a respective balanced count code.

3. The device according to claim 2, wherein the balanced count code is a balanced Gray code.

4. The device according to claim 1, wherein the memory is a non-volatile memory.

5. The device according to claim 4, wherein the non-volatile memory comprises a Flash memory.

6. The device according to claim 1, wherein the limit for each iteration is defined by a maximum value given by a number of the bits in each of the count words.

7. The device according to claim 1, wherein at least one of the memory cells is assigned to store a state indicator, and wherein the controller is coupled to increment the state indicator upon making the second assignment.

8. The device according to claim 7, wherein the controller is configured to read a value of the count code by decoding the state indicator so as to identify the groups of the memory cells storing the less significant word and the more significant word.

9. The device according to claim 1, wherein the less significant word and the more significant word are swapped between the first and second groups of the memory cells upon making the second assignment.

10. The device according to claim 1, wherein the count code comprises, in addition to the less significant and more significant words, at least a third count word, which is stored in a third group of the memory cells in accordance with the first assignment, and wherein the less significant word, the more significant word, and the third count word are swapped among the groups of the memory cells upon making the second assignment.

11. The device according to claim 10, wherein the third count word has a level of significance that is intermediate between the more and less significant words.

12. A method for counting, comprising:
    defining a count code comprising multiple count words, which comprise at least a less significant word and a more significant word;
    making a first assignment of first and second groups of memory cells, among multiple groups of the memory cells in a memory, to store the less significant word and the more significant word, respectively;

in response to occurrences of a count input, incrementing the less significant word from an initial value up to a first limit in each of a plurality of successive first iterations;

in response to reaching the first limit in each of the successive first iterations, incrementing the more significant word from an initial value up to a second limit in each of a plurality of successive second iterations;

in response to reaching the second limit, making a second assignment, different from the first assignment, of the groups of the memory cells that are to store the less significant and the more significant word; and continuing the first and second iterations subject to the second assignment.

13. The method according to claim 12, wherein each of the count words comprises a respective balanced count code.

14. The method according to claim 13, wherein the balanced count code is a balanced Gray code.

15. The method according to claim 12, wherein the memory is a non-volatile memory.

16. The method according to claim 15, wherein the non-volatile memory comprises a Flash memory.

17. The method according to claim 12, wherein the limit for each iteration is defined by the maximum value of the memory word.

18. The method according to claim 12, wherein the method comprises assigning at least one of the memory cells to store a state indicator, and upon making the second assignment, incrementing the state indicator.

19. The method according to claim 18, wherein the method comprises decoding the state indicator so as to identify the groups of the memory cells storing the less significant word and the more significant word in order to read a value of the count code.

20. The method according to claim 12, wherein making the second assignment comprises swapping the less significant word and the more significant word between the first and second groups of the memory cells.

21. The method according to claim 12, wherein the count code comprises at least a third count word in addition to the less significant and more significant words, and wherein making the first assignment comprises assigning a third group of the memory cells to store the third count word, and wherein making the second assignment comprises swapping the less significant word, the more significant word, and the third count word among the groups of the memory cells.

22. The method according to claim 21, wherein the third count word has a level of significance that is intermediate between the more and less significant words.

* * * * *